United States Patent
Su et al.

(10) Patent No.: US 6,974,659 B2
(45) Date of Patent: Dec. 13, 2005

(54) METHOD OF FORMING A SOLDER BALL USING A THERMALLY STABLE RESINOUS PROTECTIVE LAYER

(75) Inventors: Chao-Yuan Su, Kaohsiung (TW); Chia-Fu Lin, Hsin-Chu (TW); Hsin-Hui Lee, Kuohsiung (TW); Yen-Ming Chen, Hsin Chu (TW); Kai-Ming Ching, Taiping (TW); Li-Chih Chen, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 413 days.

(21) Appl. No.: 10/051,906

(22) Filed: Jan. 16, 2002

(65) Prior Publication Data
US 2003/0134233 A1    Jul. 17, 2003

(51) Int. Cl.⁷ ............... G03F 7/16; G03F 7/20; G03F 7/40; H01L 21/441; B23K 35/14
(52) U.S. Cl. ............ 430/312; 430/314; 430/319; 430/330; 438/615; 438/694; 228/246
(58) Field of Search .............. 430/311, 313–314, 430/316–319, 329–330; 438/108, 115, 612–615, 438/660, 694; 228/164, 203, 232, 246, 262.9

(56) References Cited

U.S. PATENT DOCUMENTS 6,137,125 A * 10/2000 Costas et al. ............ 257/275
6,410,414 B1 * 6/2002 Lee .......................... 438/612

* cited by examiner

Primary Examiner—Mark F. Huff
Assistant Examiner—John Ruggles
(74) Attorney, Agent, or Firm—Tung & Assoc.

(57) ABSTRACT

A method for protecting a semiconductor process wafer surface from contacting thermally degraded photoresist including providing a semiconductor process wafer having a process surface; forming a protective layer over selected areas of the process surface said protective layer including a resinous organic material having a glass transition temperature (Tg) that is about greater than a thermal treatment temperature; forming a photoresist layer over at least a portion of the protective layer to include a photolithographic patterning process; and subjecting the semiconductor process wafer to the thermal treatment temperature.

19 Claims, 3 Drawing Sheets

METHOD OF FORMING A SOLDER BALL USING A THERMALLY STABLE RESINOUS PROTECTIVE LAYER

FIELD OF THE INVENTION

This invention generally relates to semiconductor processing and more particularly to thermal degradation of photoresist layers included in flip chip bonding technology and a method for preventing the formation of difficult to remove photoresist residue on a semiconductor process wafer surface following a thermal treatment.

BACKGROUND OF THE INVENTION

Packaging of the ULSI chip is one of the most important steps in ULSI manufacturing, contributing significantly to the overall cost, performance and reliability of the packaged chip. As semiconductor devices reach higher levels of integration, packaging technologies such as chip bonding have become critical. Packaging of the chip accounts for a considerable portion of the cost of producing the device and failure of the package leads to costly yield reduction.

As semiconductor device sizes have decreased, the density of devices on a chip has increased along with the size of the chip thereby making chip bonding more challenging. One of the major problems leading to package failure as chip sizes increase is the increasingly difficult problem of thermal coefficient of expansion (TCE) mismatches between materials leading to stress buildup and consequent failure. For example, in flip chip technology chip bonding is accomplished by means of solder bumps formed on under bump metallization (UBM) layers overlying a chip bonding pad where, frequently, improper wetting (bonding) between the solder and UBM layers may lead to a bond not sufficiently strong to withstand such stresses.

In many cases it is necessary to repackage the chip after a package failure requiring costly detachment of the chip from the package and repeating the chip bonding process in a new package. Some chip bonding technologies utilize a solder bump attached to a contact pad (chip bonding pad) on the chip to make an electrical connection from the chip devices to the package. For example, C4 (Controlled-Collapse Chip Connection) is a means of connecting semiconductor chips to substrates in electronic packages. C4 is a flip-chip technology in which the interconnections are small solder balls (bumps) on the chip surface. Since the solder balls form an area array, C4 technology can achieve the highest density scheme known in the art for chip interconnections. The flip chip method has the advantage of achieving the highest density of interconnections to the device with the lowest parasitic inductance.

Solder bumps may be formed by, for example, vapor deposition of solder material over layers of under bump metallization (URM) formed on the chip bonding pad. In another method, the layers of solder material may be deposited by electrodeposition onto seed layer material deposited over UBM layers formed on the chip bonding pad. In yet another method, solder bumps may be formed by a solder-paste screen printing method using a mask (stencil) to guide the placement of the solder-paste. Typically, after deposition of the solder materials, for example, in layers or as a homogeneous mixture, the solder bump (ball) is formed after removing a photoresist mask defining the solder material location by heating the solder material to melting, where according to a reflow process, a solder ball is formed with the aid of surface tension. Alternatively, a solder bump (column) may be formed within a permanent mask made of photoresist or some other organic resinous material defining the solder bump area over the chip bonding pad.

In an exemplary process for forming a solder bump on a semiconductor chip, reference is made to FIGS. 1A–1E showing representational cross sections of an exemplary chip bonding pad with associated UBM layers and solder bump for chip bonding in flip chip technology. For example, with reference to FIG. 1A, the process of creating the solder bumps begins after chip bonding pad 10, for example Cu or Al, formed by vapor deposition has been deposited on the surface of the semiconductor wafer 8. After the chip bonding pad 10 is formed, a passivation layer 12 of, for example, silicon nitride (SiN), or silicon dioxide ($SiO_2$) is formed over the semiconductor device surface excluding a portion overlying the chip bonding pad 10. Typically, one or more under bump metallization (UBM) layers, e.g., 14A of from about 500 Angstroms to about 5000 Angstroms are then deposited over chip bonding pad 10 and a layer of photoresist 16 formed thereover as shown in FIG. 1B. The UBM layer 14A may be, for example, a layer of titanium. The photoresist layer is typically from about 10 to about 25 microns high. As shown in FIG. 1B, the photoresist layer 16 is photolithographically patterned and developed to form an opening 17 above the contact pad 10 to expose the UBM layer, e.g., 14A. Additional UBM layers may be formed within the mask opening 17 by, for example, an electroplating process or vapor deposition process forming e.g., UBM layers 14B and 14C in FIG. 1C. Layers 14B and 14C may be for example, layers of copper and nickel, respectively. UBM layers are formed over the chip bonding pad 10, for example, to allow for better bonding and wetting of the solder material to the uppermost UBM layer adjacent the solder material, e.g., 14C, and for protection of the chip bonding pad 10 by the lowermost UBM layer, e.g., 14A. A column of solder material 18A may either be deposited in layers, for example, a layer of Pb followed by a layer of Sn, the solder material layers later being formed into a homogeneous solder during a first reflow process, or may be deposited as a homogeneous solder material by for example vapor deposition or electroplating onto a seed layer (e.g., 14C).

If the column of solder material is inhomogeneous, for example, solder paste applied using the photoresist layer 16 as a stencil (stencil printing), then prior to removal of the photoresist layer 16, a first reflow process is typically performed to harden the printed solder paste and form a homogeneous column (plug) of solder material confined by the photoresist layer 16 stencil in preparation for a second reflow process for forming a solder ball carried out after removing the photoresist layer 16. After removal of the photoresist layer 16, the UBM layer 14A is typically etched through by a reactive ion etch (RIE) process to the underlying passivation layer 12 using the solder column 18A as an etching mask to protect the underlying UBM layers e.g., 14A, 14B, and 14C, as shown in FIG. 1D. The solder column 18 is then heated to reflow to form a solder bump 18B over the UBM layer 14C as shown in FIG. 1E. After reflow, a homogeneous Pb/Sn solder bump is formed including, for example, with composition ratios indicating weight percent, high lead alloys including 95 Pb/5 Sn (95/5) or 90 Pb/10 Sn (90/10) with melting temperatures, for example, in excess of 350° C. The solder bump forms a homogeneous material and has a well defined melting temperature. The lead content (high melting) Pb/Sn alloys are reliable bump metallurgies which are particularly resistant to material fatigue.

One problem with the prior art in forming a solder bump relates to the thermal degradation of the photoresist layer following a first reflow process carried out for example, on stenciled solder paste prior to removing the photoresist layer (stencil) by wet chemical stripping. In many cases, especially with high lead alloys, temperatures greater than 350° C. may be required for proper reflow treatment of the solder paste. At these temperatures, typical photoresist materials thermally degrade and adhere to the semiconductor process wafer surface, for example, to the passivation layer. After degradation, the photoresist is difficult to remove by conventional wet stripping processes and frequently leaves a residue over the wafer surface. As a result, the photoresist residue may adversely affect subsequent semiconductor wafer processing steps. For example, the photoresist residue may adversely affect the second reflow process to form the solder ball, for example interfering with proper wetting of the UBM layer.

There is therefore a need in the semiconductor processing art to develop an improved process whereby thermal degradation of a photoresist layer in contact with a semiconductor process wafer surface during a thermal treatment, including solder reflow, is avoided thereby eliminating the deposition of a thermally degraded photoresist residue to provide for a clean semiconductor process wafer surface allowing more reliable subsequent processing steps.

It is therefore an object of the invention to provide an improved process whereby thermal degradation of a photoresist layer in contact with a semiconductor process wafer surface during a thermal treatment, including solder reflow, is avoided thereby eliminating the deposition of a thermally degraded photoresist residue to provide for a clean semiconductor process wafer surface allowing more reliable subsequent processing steps, while overcoming other shortcomings and limitations of the prior art.

SUMMARY OF THE INVENTION

To achieve the foregoing and other objects, and in accordance with the purposes of the present invention, as embodied and broadly described herein, in one embodiment, the present invention provides a method for protecting a semiconductor process wafer surface from contacting thermally degraded photoresist including providing a semiconductor process wafer having a process surface; forming a protective layer over selected areas of the process surface said protective layer including a resinous organic material having a glass transition temperature (Tg) that is about greater than a thermal treatment temperature; forming a photoresist layer over at least a portion of the protective layer to include a photolithographic patterning process; and, subjecting the semiconductor process wafer to the thermal treatment temperature.

In related embodiments, the glass transition temperature (Tg) is greater than about 300 degrees Centigrade. Further, the protective layer comprises Benzocyclobutene. Further yet, the glass transition temperature (Tg) is greater than about 350 degrees Centigrade.

In another embodiment, prior to the step including the thermal treatment temperature a portion of the protective layer is removed to reveal an under bump metal layer for forming a solder column thereover.

In another embodiment, the solder column is formed within a photoresist stencil included in the photoresist layer. Further, the thermal treatment temperature is according to a reflow process carried out on the solder column. Further yet, the solder column includes a lead content of greater than about 90 weight percent.

In another embodiment, the protective layer includes at least one under bump metal layer (UBM) for forming a solder ball thereover.

In yet a further embodiment, the protective layer is removable by at least one of reactive ion etching and wet chemical stripping.

In a separate embodiment, the present invention provides an improved method for forming a solder ball in a semiconductor chip bonding process including providing a semiconductor wafer process surface including at least one under metal (UBM) layer overlying a chip bonding pad said at least one under bump metal (UBM) layer including a contact layer for forming a solder bump thereover; forming a protective layer overlaying the semiconductor wafer process surface including the contact layer said protective layer including a resinous organic material having a glass transition temperature (Tg) that is greater than a thermal treatment temperature; forming a photoresist layer over the protective layer to include a photolithographic patterning process for forming a stencil pattern including an opening for containing a solder column overlying the contact layer; removing a portion of the protective layer to reveal the contact layer for forming the solder column thereover; forming the solder column over the contact layer; and, subjecting the solder column to the thermal treatment temperature to induce solder reflow.

In related embodiments the glass transition temperature (Tg) is greater than about 300 degrees Centigrade. Further, the protective layer comprises Benzocyclobutene. Further yet, the glass transition temperature (Tg) is greater than about 350 degrees Centigrade.

In other related embodiments, the solder column includes a lead content of greater than about 90 weight percent. Further, the at least one under bump metal layer (UBM) includes at least one of titanium, copper, and nickel.

In another embodiment, the protective layer is removable by at least one of reactive ion etching and wet chemical stripping.

In another embodiment, the method further includes the step of removing the photoresist layer and underlying protective layer by a wet chemical stripping process.

In a another embodiment, the method further includes the step of depositing a UBM masking photoresist layer over the at least one UBM layer; and, reactive ion etching the lowermost UBM layer to reveal a passivation layer surrounding a chip bonding pad area. In another embodiment, the method further includes the step of performing a second solder reflow process to form a solder ball.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
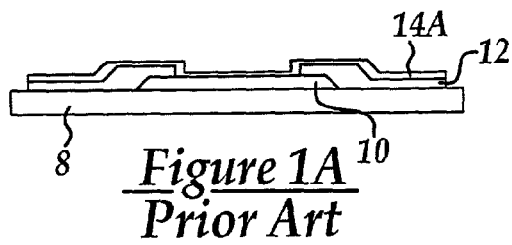
FIGS. 1A–1E are cross-sectional side view representations of an exemplary process according to the prior art for forming a solder bump over a chip bonding pad at stages in a manufacturing process.
Figure 1B:
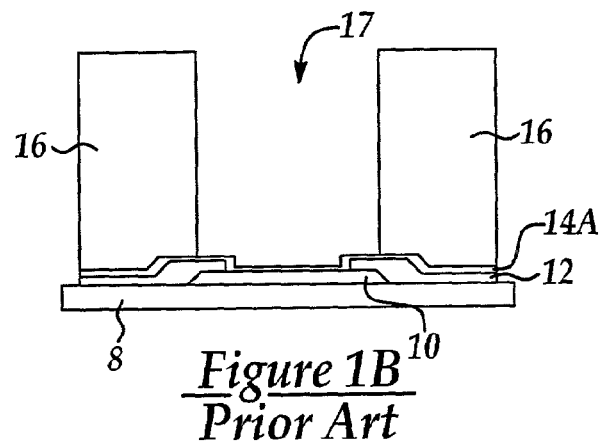
Figure 1C:
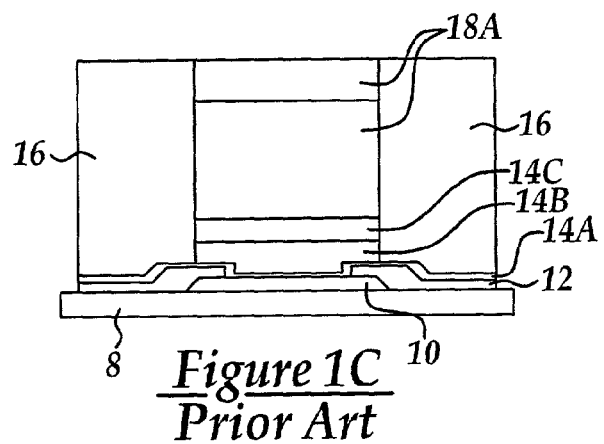
Figure 1D:
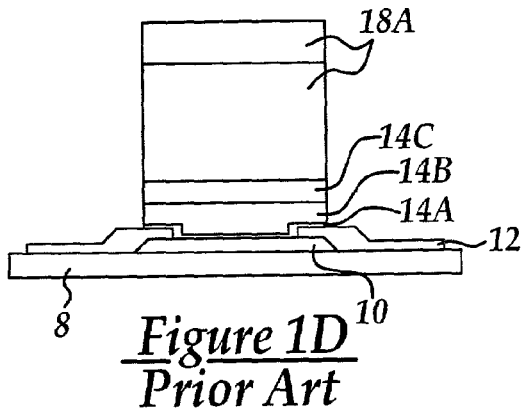
Figure 1E:
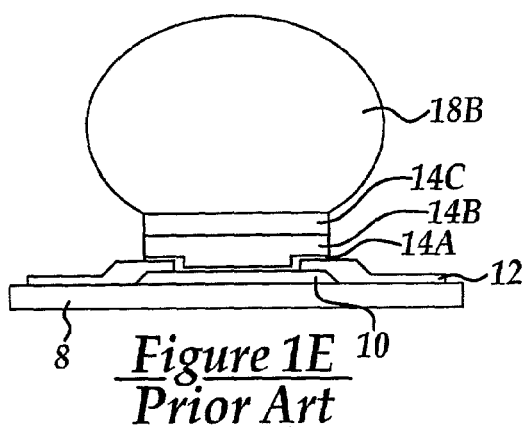
Figure 2A:
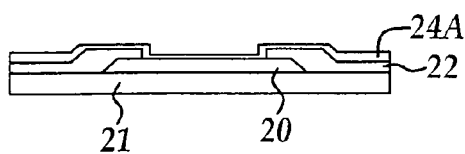
FIGS. 2A–2F are cross-sectional side view representations of an exemplary process according to the present invention for forming a protective layer over a semiconductor wafer process surface according to the present invention at selected stages in a manufacturing process.

The method according to the present invention is more clearly described by referring to FIG. 2A which is a representative cross-sectional side view of a stage in a manufacturing process for creating a solder bump bonded to a UBM layer overlying a chip bonding pad. For example, with reference to FIG. 2A, the process of creating the solder bumps begins after chip bonding pad 20, for example Cu or Al, typically formed by vapor deposition, has been deposited on the surface of the substrate 21, for example an underlying layer forming a portion of a semiconductor device and forming a surface of a semiconductor process wafer. After the chip bonding pad 20 is formed, a passivation layer 22 of, for example, silicon nitride (SiN), or silicon dioxide ($SO_2$) is formed over the semiconductor device surface excluding a portion overlying the chip bonding pad 20. Typically, at least one under bump metallization (UBM) layer, e.g., 24A of from about 500 Angstroms to about 5000 Angstroms in thickness is then deposited, for example by physical vapor deposition, over the semiconductor process wafer surface including chip bonding pad 20.

Figure 2B:
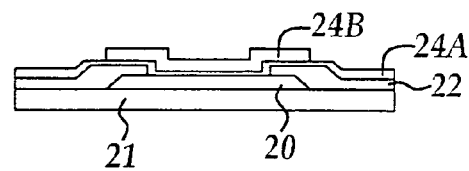
Figure 2C:
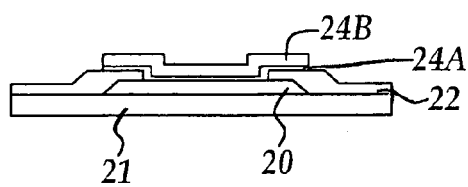

According to the method of the present invention, following deposition of the UBM layer 24A, more UBM layers may be optionally deposited (not shown). In an exemplary embodiment for example, the UBM layer 24A is a lowermost UBM layer of titanium followed by a copper layer (not shown) and an uppermost contact layer (not shown), for example nickel, for forming a solder bump thereover. In the exemplary embodiment shown in FIG. 2A, the UBM layer 24A also forms the contact layer. A first layer of photoresist 24B for masking the at least one UBM layer is then deposited and patterned and developed by conventional photolithographic processes to leave photoresist layer 24B forming an etching mask overlying the chip bonding pad 20 area including UBM layer 24A as shown in FIG. 2B. The at least one UBM layer 24A is then etched according to a conventional reactive ion etching (RIE) process to remove the portion of UBM layer 24A area not covered by photoresist layer 24B to reveal the passivation layer 22, for example, surrounding the chip bonding pad 20 as shown in FIG. 2C.

Figure 2D:
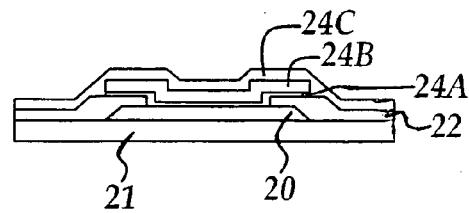

According to the present invention a protective layer 24C of organic material, for example, Benzocyclobutene (BCB), having a glass transition temperature (Tg) about greater than a thermal treatment temperature, for example 350° C., is deposited over the first layer of photoresist 24B to include deposition over exposed portions of passivation layer 22 as shown in FIG. 2D. Preferably, the protective layer 24C is applied by a conventional spin coating process. The protective layer 24C is preferably an organic resinous material that can withstand thermal degradation at temperatures at least greater than about 300° C. For example, a suitable organic resinous material includes BCB having a glass transition temperature Tg of greater than about 350° C. For example, a resinous organic material that has suitable thermal stability at temperatures greater than about 350° C. is CYCLOTENE™ 4026-46, a Benzocyclobutene (BCB) commercially available from DOW Chemical.

While a resinous organic material that has a thermal stability at temperatures greater than about 350° C. is preferable, especially where high lead solder pastes are used which require reflow temperatures of greater than about 300° C., it will be appreciated that an organic resinous material that has thermal stability including a glass transition temperature (Tg) greater than about a thermal treatment temperature (reflow temperature) such that thermal degradation is avoided at the reflow temperature may be advantageously used according to the present invention. For example, if the glass transition temperature (Tg) of the resinous organic material is about greater than (equal to or greater than) a reflow temperature (thermal treatment temperature), such a resinous organic material may be advantageously used according to the present invention to form protective layer 24C.

Figure 2E:
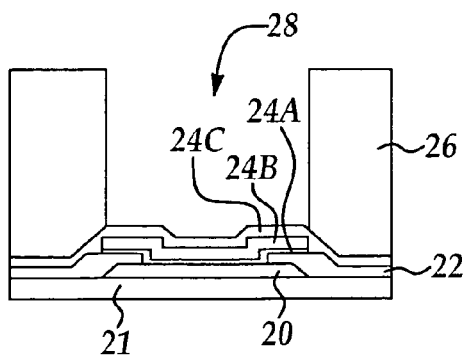
Figure 2F:
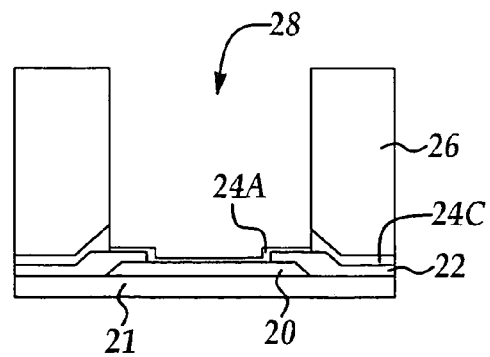

Following application of the resinous organic protective layer 24C according to the present invention, a second photoresist layer 26 is applied over the protective layer 24C, patterned and developed according to conventional photolithographic processes to form a stencil pattern including, e.g., opening 28 overlying the chip bonding pad 20 area as shown in FIG. 2E. The second photoresist layer 26 including e.g., opening 28 forms a stencil pattern for subsequent stencil printing of solder paste to fill opening 28. Prior to stencil printing the solder paste, the protective layer 24C and first photoresist layer 24B within opening 28 are removed according to a conventional ashing process, for example an oxygen containing reactive ion etching process, to give the structure shown in FIG. 2F.

Figure 3A:
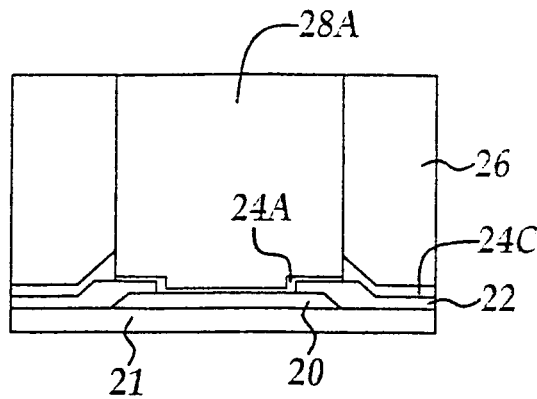
FIGS. 3A–3C are cross-sectional side view representations of an exemplary process according to the present invention for forming a solder bump over the protective layer according to the present invention at selected stages in a manufacturing process.

Turning to FIG. 3A, the photoresist layer 26 forming a stencil pattern including, for example, opening 28, for applying a solder paste is then filled with solder paste as shown in FIG. 3A and subjected to a first reflow process at an appropriate thermal treatment (reflow) temperature, for example, about 350° C., to allow the solder paste to homogenize and harden into a solder column 28A.

After reflow, a homogeneous Pb/Sn solder column is formed including, for example, with composition ratios indicating weight percent, high lead alloys including 95 Pb/5 Sn (95/5) or 90 Pb/10 Sn (90/10) with melting temperatures in excess of 300° C.

Figure 3B:
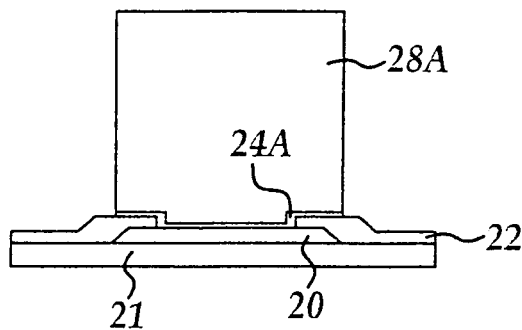

Following the first reflow process, the photoresist layer 26 as well as the remaining underlying protective layer 24C are removed according to a conventional wet chemical stripping procedure to leave the solder column 28A as shown in FIG. 3B.

Figure 3C:
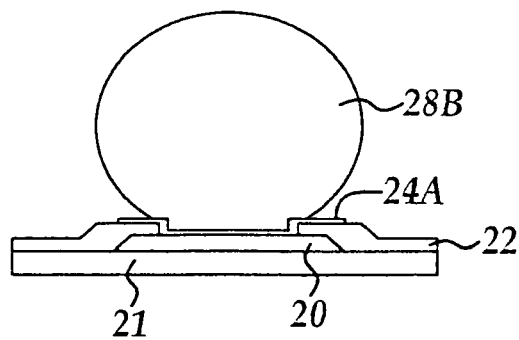

According to the present invention, removal of the photoresist layer 16 and the underlying protective layer 24C results in a semiconductor process wafer surface including, for example, passivation layer 22 surface free of photoresist residue. As such, the subsequent second reflow process to form solder ball 28B as shown in FIG. 3C is accomplished without adverse affect from residual photoresist, while ensuring that subsequent semiconductor packaging steps likewise proceed without adverse consequences from residual photoresist remaining on the process wafer surface, thereby increasing a throughput and semiconductor wafer package yield.

Although the present invention has been explained with reference to a particular sequence of steps in forming a photoresist stencil for stencil printing, it will be appreciated that the application of the protective resinous organic layer according to the present invention may be advantageously used in a different sequence of processing steps. It will be appreciated that the protective resinous organic layer with enhanced thermal stability, for example having a glass transition temperature (Tg) about greater than a thermal treatment temperature, may be used in any sequence of steps for forming a solder bump where a protective resinous organic layer with enhanced thermal stability will act to prevent thermal degradation of a photoresist layer in contact with a process wafer surface, thereby causing a residue of photoresist to remain on a process wafer surface.

It will be further appreciated that the protective resinous organic layer with enhanced thermal stability, for example having a glass transition temperature (Tg) about greater than a thermal treatment temperature, according to the present invention may likewise be used in any semiconductor fabrication process where a photoresist layer may be subjected to a high temperature process that may cause photoresist thermal degradation, thereby protecting the semiconductor wafer process surface from a residue of thermally degraded photoresist that is difficult to remove.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for protecting a semiconductor process wafer surface from thermally degraded photoresist to improve a solder ball formation process comprising the steps of:
    providing a semiconductor process wafer having a process surface comprising a passivation layer and an exposed UBM contact layer;
    forming a protective layer over the passivation layer and the exposed UBM contact layer, the protective layer comprising a resinous organic material having a glass transition temperature (Tg) that is about greater than a solder reflow temperature;
    forming a patterned photoresist layer on the protective layer, the patterned photoresist layer comprising an opening overlying the UBM contact layer;
    forming a solder column within the opening on the UBM contact layer; and,
    subjecting the solder column with the patterned photoresist in place to a first reflow temperature.

2. The method of claim 1, wherein the glass transition temperature (Tg) is greater than about 300 degrees Centigrade.

3. The method of claim 1, wherein the protective layer comprises Benzocyclobutene.

4. The method of claim 1, wherein the glass transition temperature (Tg) is greater than about 350 degrees Centigrade.

5. The method of claim 1, wherein the solder column comprises a lead content of greater than about 90 weight percent.

6. The method of claim 1, wherein the protective layer is removable by at least one of reactive ion etching and wet chemical stripping.

7. The method of claim 1, further comprising the steps of:
    removing remaining portions of the protective layer and photoresist layer; and,
    subjecting the solder column to a second reflow temperature to form a solder ball.

8. The method of claim 1, wherein an oxygen ashing process is carried out to remove the protective layer at the bottom of the opening to reveal the UBM contact layer prior to the step of forming the solder column.

9. An improved method for forming a solder ball to avoid photoresist residue in a solder ball formation process comprising the steps of:
    providing a semiconductor wafer process surface comprising an under bump metal (UBM) contact layer for forming a solder ball thereover;
    forming a protective layer overlying the semiconductor wafer process surface comprising the UBM contact layer, said protective layer comprising a resinous organic material having a glass transition temperature (Tg) that is greater than a solder column reflow temperature;
    forming a patterned photoresist layer over the protective layer, the patterned photoresist layer comprising an opening for containing the solder column overlying the UBM contact layer;
    removing a portion of the protective layer within the opening to reveal the UBM contact layer;
    forming the solder column on the UBM contact layer;
    subjecting the solder column to a first reflow temperature;
    removing remaining portions of the protective layer and the photoresist layer; and,
    subjecting the solder column to a second reflow temperature to form the solder ball.

10. The method of claim 9, wherein the glass transition temperature (Tg) is greater than about 300 degrees Centigrade.

11. The method of claim 9, wherein the protective layer comprises Benzocyclobutene.

12. The method of claim 9, wherein the glass transition temperature (Tg) is greater than about 350 degrees Centigrade.

13. The method of claim 9, wherein the solder column includes a lead content of greater than about 90 weight percent.

14. The method of claim 9, wherein the UBM contact layer forms an uppermost under bump metal layer (UBM), wherein the UBM layer is selected from the group consisting of titanium, copper, and nickel.

15. The method of claim 9, wherein the protective layer is removable by at least one of reactive ion etching and wet chemical stripping.

16. The method of claim 9, wherein the step of removing comprises a wet chemical stripping process.

17. The method of claim 9, wherein the step of providing a semiconductor wafer process comprises depositing a UBM masking photoresist layer over the UBM contact layer followed by reactive ion etching to reveal a passivation layer surrounding the UBM contact layer.

18. The method of claim 9, wherein the step of removing a portion of the protective layer comprises an oxygen ashing process.

19. The method of claim 9, wherein the passivation layer is selected from the group consisting of silicon nitride and silicon oxide.

* * * * *